United States Patent
Iwane et al.

(10) Patent No.: US 7,420,282 B2
(45) Date of Patent: Sep. 2, 2008

(54) CONNECTION STRUCTURE FOR CONNECTING SEMICONDUCTOR ELEMENT AND WIRING BOARD, AND SEMICONDUCTOR DEVICE

(75) Inventors: Tomohiko Iwane, Fukuyama (JP); Nakae Nakamura, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 33 days.

(21) Appl. No.: 11/250,513

(22) Filed: Oct. 17, 2005

(65) Prior Publication Data

US 2006/0081999 A1    Apr. 20, 2006

(30) Foreign Application Priority Data

Oct. 18, 2004  (JP) .............................. 2004-303508

(51) Int. Cl.
*H01L 23/48* (2006.01)
*H01L 23/52* (2006.01)
*H01L 29/40* (2006.01)

(52) U.S. Cl. ....................................... 257/778; 257/690

(58) Field of Classification Search ................. 257/778, 257/698, 700, 701, 779, 786, 693, 666, 690, 257/784

See application file for complete search history.

(56) References Cited

U.S. PATENT DOCUMENTS

| 5,877,556 | A | 3/1999 | Jeng et al. ..................... 257/737 |
| 6,084,301 | A | 7/2000 | Chang et al. .................. 257/737 |
| 6,518,649 | B1 | 2/2003 | Iwane et al. |
| 6,522,017 | B2 * | 2/2003 | Horiuchi et al. .............. 257/778 |
| 6,943,442 | B2 * | 9/2005 | Sunohara et al. ............. 257/700 |
| 6,952,049 | B1 * | 10/2005 | Ogawa et al. ................ 257/700 |
| 2002/0121689 | A1 * | 9/2002 | Honda ......................... 257/700 |
| 2003/0168748 | A1 * | 9/2003 | Katagiri et al. ............. 257/778 |
| 2004/0113260 | A1 * | 6/2004 | Sunohara et al. ............ 257/698 |
| 2005/0253248 | A1 * | 11/2005 | Shimizu et al. ............. 257/700 |
| 2005/0285266 | A1 * | 12/2005 | Reiss et al. ................. 257/738 |
| 2006/0060960 | A1 * | 3/2006 | Cho et al. ................... 257/700 |
| 2006/0231949 | A1 * | 10/2006 | Park et al. ................... 257/737 |

FOREIGN PATENT DOCUMENTS

| JP | 64-27246 A | 1/1989 |
| JP | 02-082544 A | 3/1990 |
| JP | 08-316360 | 11/1996 |
| JP | 2000-133664 A | 5/2000 |
| JP | 2001-176918 A | 6/2001 |
| JP | 2003-273162 A | 9/2003 |
| JP | 2004-119474 A | 4/2004 |
| JP | 2004-158632 A | 6/2004 |
| JP | 2004-281521 A | 10/2004 |

* cited by examiner

*Primary Examiner*—S. V. Clark
(74) *Attorney, Agent, or Firm*—Harness, Dickey & Pierce, P.L.C.

(57) ABSTRACT

In a connection structure of the present invention, the wiring board including a solder resist covering part which covers the wiring pattern with solder resist, the solder resist covering part having a solder resist opening or solder resist openings which expose(s) the wiring board connection terminals therethrough, and the solder resist opening or the solder resist openings surrounding at least one part of the solder resist covering part. Therefore, the wiring patterns are not unnecessarily exposed. That is, without disadvantageous contact between each wiring pattern and the semiconductor element, the semiconductor element can be mounted on the wiring board, and thus, the semiconductor device is reliable.

16 Claims, 5 Drawing Sheets

CONNECTION STRUCTURE FOR CONNECTING SEMICONDUCTOR ELEMENT AND WIRING BOARD, AND SEMICONDUCTOR DEVICE

This Nonprovisional application claims priority under 35 U.S.C. § 119(a) on Patent Application No. 303508/2004 filed in Japan on Oct. 18, 2004, the entire contents of which are hereby incorporated by reference.

FIELD OF THE INVENTION

The present invention relates to connection structure for use in a case in which a semiconductor element is mounted on a flexible wiring board by means of COF (CHIP ON FLEXIBLE PRINTED CIRCUIT) method.

BACKGROUND OF THE INVENTION

Widely used is a COF (CHIP ON FLEXIBLE PRINTED CIRCUIT) semiconductor device mountable in a narrow space or a space of complex shape. In the COF semiconductor device, a semiconductor element is bonded to or mounted on (connected to) a flexible wiring board. In the flexible wiring board, wiring patterns are formed on a flexible insulating tape substrate, referred as a tape carrier. A conventional COF semiconductor device is disclosed, for example, in Japanese Unexamined Patent Publication No. 27246/1989 (Tokukai-sho 64-27246, disclosure date: Jan. 30, 1989).

FIGS. 7 to 9 illustrate a bonding structure for bonding the flexible wiring board with the semiconductor element in the conventional COF semiconductor device. FIG. 7 schematically shows a plan view of a flexible wiring board 101 in the conventional COF semiconductor device. FIG. 8 schematically shows a plan view of an area in which the semiconductor element is mounted on the flexible wiring board 101 shown in FIG. 7. FIG. 9 schematically shows a cross-sectional view of the conventional COF semiconductor device 110. Note that, FIG. 8 shows a semiconductor element 111 by the dashed line, and its bump electrodes 112 (semiconductor connection terminals) by the chain double-dashed line.

As shown in FIG. 7, in the conventional flexible wiring board 101, a plurality of the wiring patterns 103 are formed on the insulating tape substrate 102. As shown FIGS. 7 and 8, one ends of the wiring patterns are connected to the corresponding bump electrodes 112 of the semiconductor element 111. The above one ends are referred to as inner leads 131. As shown FIG. 7, the other ends of the wiring patterns 103 are connected to corresponding outer circuits. The above other ends are referred to as outer leads 132.

Further, a surface of the flexible wiring board 101 may be covered with an insulating solder resist 141. The solder resist 141 protects the wiring patterns 103.

However, in a semiconductor 111 mounting area, which is the area that is surrounded by the dashed line, the outer lead 132 and its peripheral part are not covered by the solder resist 141 and exposed. Hereinafter, a covered area with the solder resist 141 is referred to as a solder resist covering part, and an uncovered area with the solder resist 141, in which the inner lead 131 are provided, is referred to as a solder resist opening. As shown in FIG. 8, in the conventional flexible wiring board 101, the solder resist opening 142 includes (exposes) whole of the semiconductor 111 mounting area, and thus, is wider than the area.

As shown in FIG. 9, in the conventional COF semiconductor device 110, the semiconductor element 111 is mounted on the flexible wiring board 101. On mounting, the electrodes 112 of the semiconductor element 111 and the corresponding inner leads 131 of the flexible wiring board 101 are bonded to each other. The bonding of the bump electrodes 112 to the corresponding inner leads 131 is generally carried out by applying heat and pressure thereby to alloy their materials with each other or to bond them by thermocompression. After bonding, insulating resin 114 may be injected between the flexible wiring board 101 and the semiconductor element 111, and then cured, in order to prevent the inner lead 131 from being exposed.

As described above, a solder resist opening 142 on a flexible wiring board 101 includes (exposes) whole of the semiconductor element 111 mounting area, and is wider than the area, in the above conventional flexible wiring board. Such a flexible wiring board 101 is so arranged that not only each inner lead 131 which is bonded to a corresponding electrode 112, but also the other portion of each wiring pattern 103 are within the solder resist opening 142, and exposed therethrough.

Thereby, on mounting the semiconductor element 111, contact between another portions than the bump electrodes 112 on the semiconductor element 111 and wiring patterns 103 can disadvantageously occur, hereby the semiconductor element 111 can be disadvantageously damaged. Such disadvantageous contact may occur, for example, when the semiconductor element 111 is in contact with that end portion 133 of the wiring pattern 103 which is on the same end as the inner lead 131 but is not included in the inner lead 131, or with a wiring 134 formed within the solder resist opening 142. Such disadvantageous contact may also occur, for example, when a wiring pattern 103 and an edge (end) of the semiconductor element 111 are in contact with each other.

SUMMARY OF THE INVENTION

In view of this conventional problems, an object of the present invention is to provide a reliable semiconductor device by not making disadvantageous contact between a semiconductor element and each wiring pattern, when mounting the semiconductor element on the wiring board, that is when bonding each semiconductor element connection terminal to the corresponding wiring board wiring.

To solve the above conventional problem, a connection structure for electrically connecting (i) a plurality of semiconductor element connection terminals of a semiconductor element with (ii) a plurality of wiring board connection terminals of a wiring pattern provided on a wiring board. The wiring board includes a solder resist covering part which covers the wiring pattern with solder resist, the solder resist covering part having a solder resist opening or solder resist openings which expose(s) the wiring board connection terminals therethrough. The solder resist opening or the solder resist openings surrounding at least one part of the solder resist covering part.

In this arrangement, the solder resist opening that surrounds at least one part of the solder resist covering part, has the wiring board connection terminal/the wiring board connection terminals. That is, the wiring board connection terminals that are connected to the corresponding semiconductor element connection terminals, are exposed, and the wiring patterns except the wiring board connection terminals are covered with the solder resist. Thus, the wiring patterns are not unnecessarily exposed. That is, without disadvantageous contact between wiring patterns and the semiconductor element, the semiconductor element can be mounted on the wiring board, and thus, the semiconductor device is reliable.

Additional objects, features, and strengths of the present invention will be made clear by the description below. Further, the advantages of the present invention will be evident from the following explanation in reference to the drawings.

DESCRIPTION OF THE EMBODIMENTS

An embodiment of the present invention will be explained below with reference to FIGS. 1-6.

Figure 1:
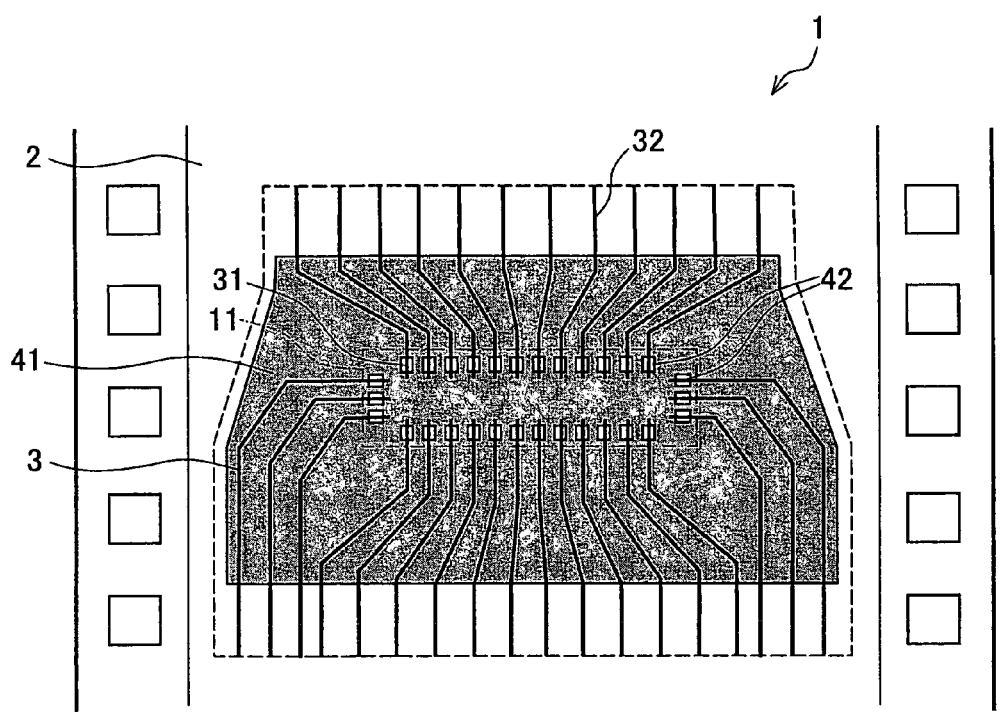
FIG. 1 is a plan view schematically illustrating a flexible wiring board according to an embodiment of the present invention.
Figure 2:
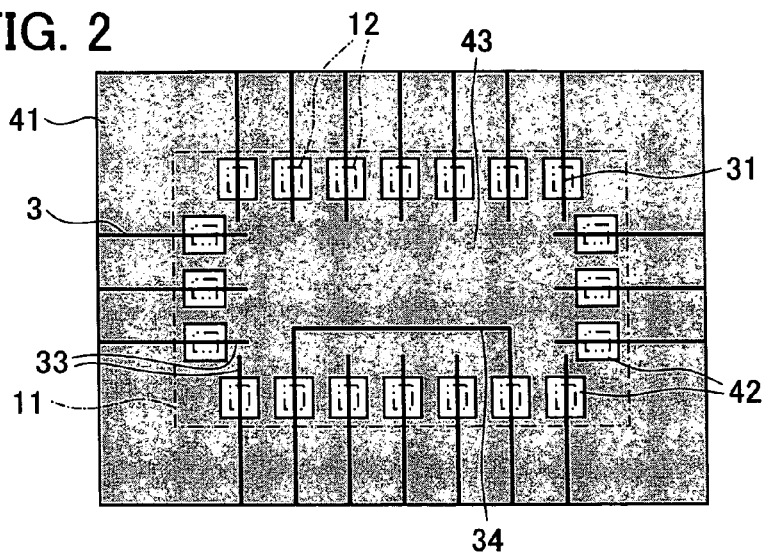
FIG. 2 is a plan view illustrating an arrangement of a semiconductor element mounting area on the flexible wiring board shown in FIG. 1.
Figure 3:
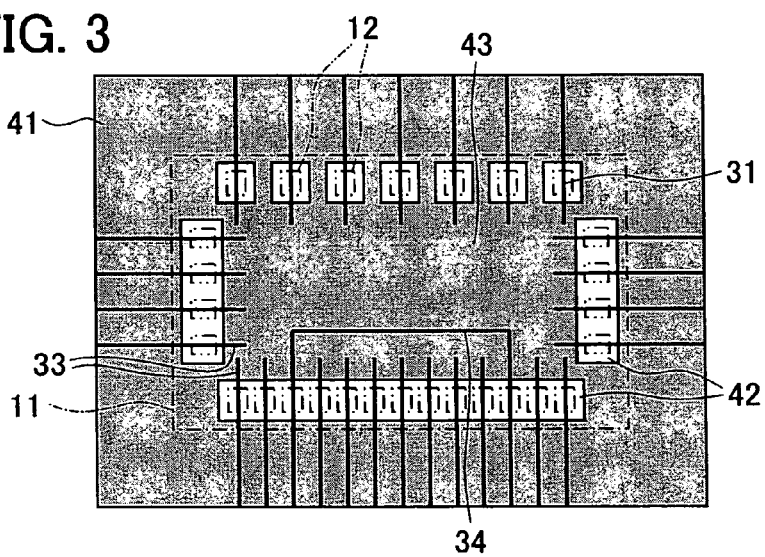
FIG. 3 is a plan view illustrating another arrangement of the semiconductor element mounting area on the flexible wiring board according to the present embodiment.
Figure 4:
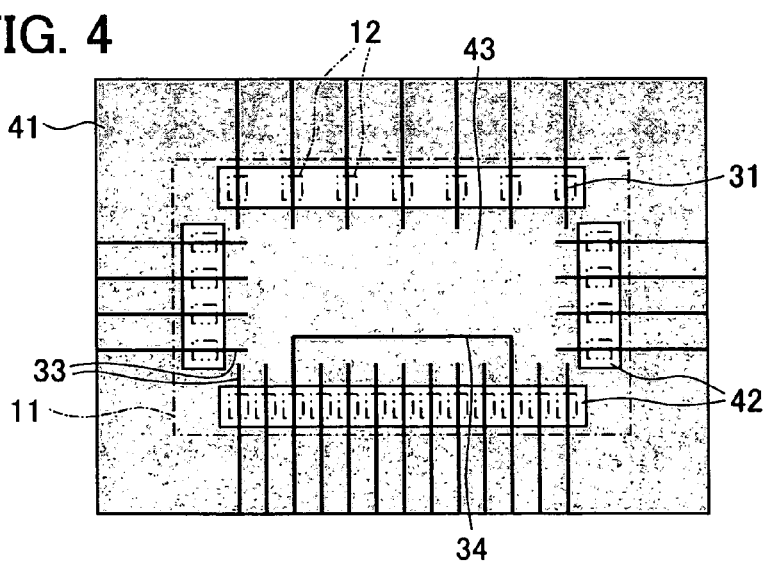
FIG. 4 is a plan view illustrating still another arrangement of the semiconductor element mounting area on the flexible wiring board according to the present embodiment.

FIG. 1 schematically shows a plan view of a flexible wiring board 1 (a wiring board) according to the present embodiment. FIG. 2 schematically shows a plan view of a semiconductor element mounting area on the flexible wiring board 1 shown in FIG. 1. FIGS. 3 and 4 show another plane views of the semiconductor element mounting area on the flexible wiring board 1. In FIGS. 1-4, a semiconductor element 11 that is mounted on the flexible wiring board 1, is indicated by the dashed line. In FIGS. 2-4, bump electrodes 12 (semiconductor element connection terminals) of the semiconductor element 11, are indicated by chain double-dashed line. That is, an area that is represented by the dashed line on the flexible wiring board 1 is the semiconductor element mounting area.

As shown in FIG. 1, a flexible wiring board 1 according to the present embodiment is so arranged that a plurality of wiring patterns 3 are formed on an insulating tape substrate 2 (an insulating substrate) having a long sheet like shape. The semiconductor element 11 is mounted on the corresponding flexible wiring board 1 thereby to form a COF semiconductor device (a COF semiconductor device 10 in FIG. 6). Thereafter, the flexible wiring board 1 is cut, as indicated by the dashed line as shown in FIG. 1, into COF semiconductor devices. A method for manufacturing of the COF semiconductor device will be described later.

The wiring pattern 3 includes an outer lead 32 for connecting between the COF semiconductor device described later and an external circuit. The wiring pattern 3 includes an inner lead. The inner lead is a portion of the wring pattern 3 that is located inwardly with respect to the outer lead 32 of the flexible wiring board 1. A part of the inner lead is a connection terminal 31 (a wiring board connection terminal) for establishing connection with a bump electrode (not shown in FIG. 1) of the semiconductor element 11. In order to express positional relationship with respect to the flexible wiring board 1, the term "outward (or outside)" is used to indicate that something is located toward an outer circumference (the dashed line) of the thus cut-out flexible wiring board 1, with respect to something else, and terms "inward (or inside)" indicates something is located away from the outer circumference of the thus cut-out flexible wiring board 1 with respect to something else.

On the surface on which the wiring pattern 3 is formed, the flexible wiring board 1 has a solder resist covering part which is covered with the solder resist 41. The wiring pattern 3 is protected by the solder resist 41, but the connection terminal 31 and the outer lead 32 are not covered with the solder resist 41. Particularly, a portion where is not covered with the solder resist 41 and the connection terminal 31 is included is called a solder resist opening 42.

That is, the flexible wiring board 1 has the solder resist covering part where the wiring pattern 3 is covered with the solder resist 41, and the solder resist opening 42 through which the connection terminal 31 is exposed. A plurality of the solder resist openings 42 surround at least a part of the solder resist covering part 41.

It is desirable that the tape substrate 2 is a flexible insulating film which can be easily bended. The flexible insulating film may be made of, for example, a polyimide resin, a polyester resin, or the like.

The wiring patterns 3 are formed, for example, by etching copper leaf which has been bonded to the tape substrate 2.

Hereinafter, the embodiment of the present invention will be explained with reference to FIGS. 2-4.

As shown in FIG. 2, the connection terminals 31 and the solder resist openings 42 are positioned according to where the bump electrodes 12 are located and within the semiconductor element 11 mounting area (dashed line). The connection terminals 31 and the solder resist openings 42 are arranged along an outer circumference (dashed line) of the semiconductor element 11 mounting area. So, an area 43 near the center of the semiconductor element 11 mounting area is covered with solder resist and is surrounded by the solder resist openings 42. That is, on the flexible wiring board 1 of the present embodiment, an inside portion (the area 43) located inwardly with respect to the portions which are to be bonded with the bump electrodes 12 of the semiconductor element 11, is covered with the solder resist 41. That is, wiring ends 33 and a wiring 34 passing in the semiconductor element mounting area are covered with the solder resist 41.

Thus, on the wiring patterns 3, portions except the connection terminals 31 which are necessary for bonding to the bump electrode 12, are protected by the solder resist 41. Therefore, the semiconductor element 11 and the wiring patterns (for example, the wiring ends 33 or the wiring 34 formed in the semiconductor element mounting area) are prevented from unnecessarily bonding.

As shown in FIGS. 2-4, one connection terminal 31 or a plurality of the connection terminals 31 may be exposed through one solder resist opening 42 according to the present embodiment. That is, as shown in FIG. 2, one solder resist opening 42 may be provided for one connection terminal 31. As shown in FIG. 3, the solder resist openings 42 may be so provided that at least one of the solder resist openings 42 has the connection terminals 31, and the other solder resist openings 42 each corresponds to one connection terminal 31. As shown in FIG. 4, each solder resist opening 42 may expose a plurality of the connection terminals 31, or one solder resist opening 42 may expose all connection terminals 31 (not shown) and has a shape surrounding a part of the solder resist 41.

As described above, the solder resist opening or at least one of the solder resist openings may expose two or more of the wiring board connection terminals therethrough.

Recently, high functional and miniaturized semiconductor device has been sought, and now, such a COF semiconductor device is also sought. In response to this demand, many semiconductor devices are so designed that a pitch between the bump electrodes is 50 μm or less. In such a fine-pitch semiconductor device, it is difficult to form the solder resist on the flexible wiring board such that one bump electrode corresponds to one solder resist opening. In this case, as shown in FIGS. 3 and 4, a solder resist opening 42 can be provided to expose a plurality of the connection terminals 31 in neighborhood on the flexible wiring board 1.

As clearly described above, "a solder resist opening/solder resist openings surrounding at least a part of the solder resist covering part" is, in other words, such an arrangement of the flexible wiring board that the portion of the semiconductor element mounting area which is located inwardly with respect to the positions where the connection terminals are bonded to the semiconductor element are covered with the solder resist in the semiconductor element mounting area. That is, the portions except the connection terminals on the semiconductor element mounting area are not necessarily protected by the solder resist 41 on the flexible wiring board, as long as the wiring patterns located inwardly with respect to the connection terminals are protected by the solder resist.

Figure 10:
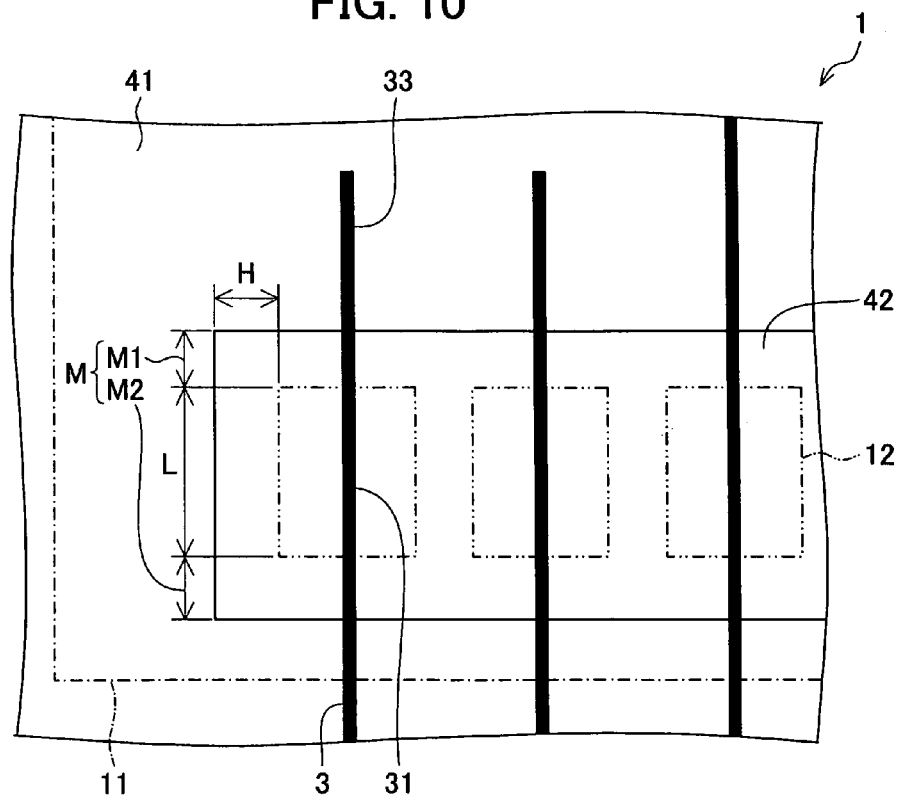
FIG. 10 is a plan view illustrating a partial arrangement of the flexible wiring board according to the present embodiment.

The flexible wiring board 1 may be arranged as illustrated in FIG. 10. FIG. 10 is a plan view illustrating a partial arrangement of the flexible wiring board according to the present embodiment. The structural components in FIG. 10 which are similar or have similar functions to already explained components, are labeled in the same manner, and their explanation is omitted here.

The flexible wiring board 1 illustrated in FIG. 10 includes the tape substrate 2, the wiring patterns provided on the tape substrate 2, and the solder resist covering part where the wiring patterns 3 are covered with the solder resist 41. The solder resist covering part has a solder resist opening/solder resist openings 42 which expose(s) a portion of at least one of the wiring patterns 3. The wiring patterns 3 are arranged to extend through the solder resist opening(s) 42. Within the solder resist opening(s) 42, each wiring pattern 3 includes the connection terminal 31 for establishing connection to the bump electrode 12 of the semiconductor element 11.

The flexible wiring board 1 may be also arranged as follows: the flexible wiring board 1 includes the tape substrate 2, the wiring patterns provided on the tape substrate 2, and the solder resist covering part where the wiring patterns 3 are covered with the solder resist 41. The solder resist covering part has a solder resist opening/solder resist openings 42 which expose(s) a part of at least one of the wiring patterns 3. In this arrangement, the flexible wiring board 1 is arranged such that L is equal to or more than M (M1+M2), where L is a length of that part (that is, the connection terminal 31) of each wiring pattern 3 exposed through the solder resist opening(s) 42, which is not/is not to be connected to a corresponding bump electrode 12 of the semiconductor element 11, and M is a length of that part (that is, non-connection part 35) of each wiring pattern 3 exposed through the solder resist opening(s) 42. The length L is preferably longer than the length M.

In this arrangement, the part which is not used for establishing the connection is protected with the solder resist 41 substantially (that is, this part becomes the solder resist covering part). As long as the flexible wiring board 1 is arranged as shown in FIG. 10, the solder resist opening(s) 42 do/dose not need to surround the solder resist covering part.

Each solder resist opening 42 has a size large enough for allowing the bump electrode 12 and the corresponding connection terminal 31 to be electrically connected to each other, but small enough to let the solder resist 41 cover a portion of the wiring pattern 3 which is not used for this connection. As shown in FIG. 10, any one of distances (M1, M2 and H) from a boundary between the solder resist 41 and the solder resist opening 42 to a part where each bump electrode 12 is bonded is on the order of 0.01 to 0.15 mm. The distances M1 and M2 each are from the boundary between the solder resist 41 and the solder resist opening 42 to the wiring board connection terminal 31, in a longitudinal direction of the wiring patterns 3. The distance H is from the boundary between the solder resist 41 and the solder resist opening 42 to the part where each bump electrode 12 is bonded, in perpendicular to the longitudinal direction of the wiring patterns 3. If the distance is less than 0.01 mm, each bonding area between the bump electrode 12 and the corresponding inner lead is too narrow and very precise alignment is required. If the distance is more than 0.15 mm, the portion of the wiring pattern 3 which does not necessary for the bonding between ach bump electrode 12 and the corresponding inner lead is exposed. Such exposure may cause a disadvantage such as a short circuit. Hereinafter, a bonding between the semiconductor element 11 and the flexible wiring board according to the present invention will be explained on the basis of FIGS. 5 and 6.

Figure 5:
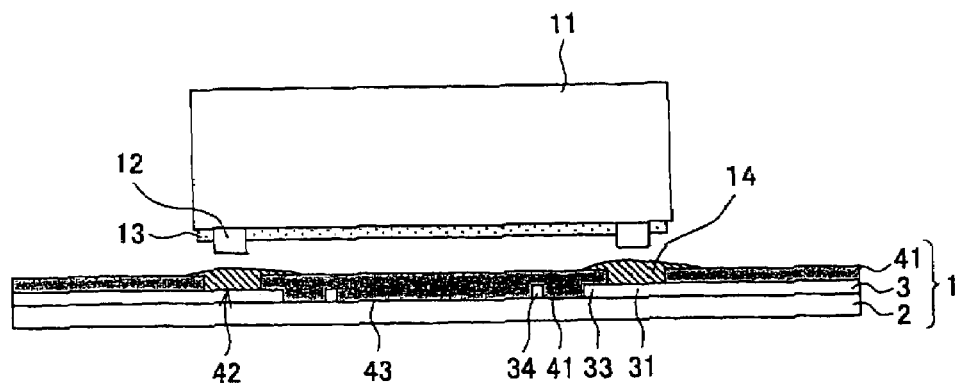
FIG. 5 is a cross-sectional view schematically illustrating the semiconductor element and the flexible wiring board, before bump electrodes and corresponding inner leads according to the present embodiment are bonded to each other.
Figure 6:
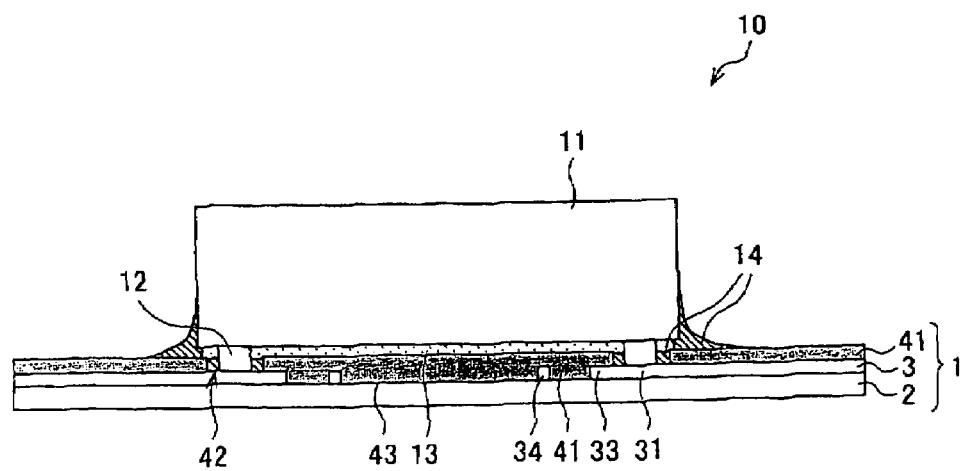
FIG. 6 is a cross-sectional view schematically illustrating the COF semiconductor device according to the present embodiment, after the bump electrodes and the corresponding inner leads as shown in FIG. 5 have been bonded to each other.
Figure 7:
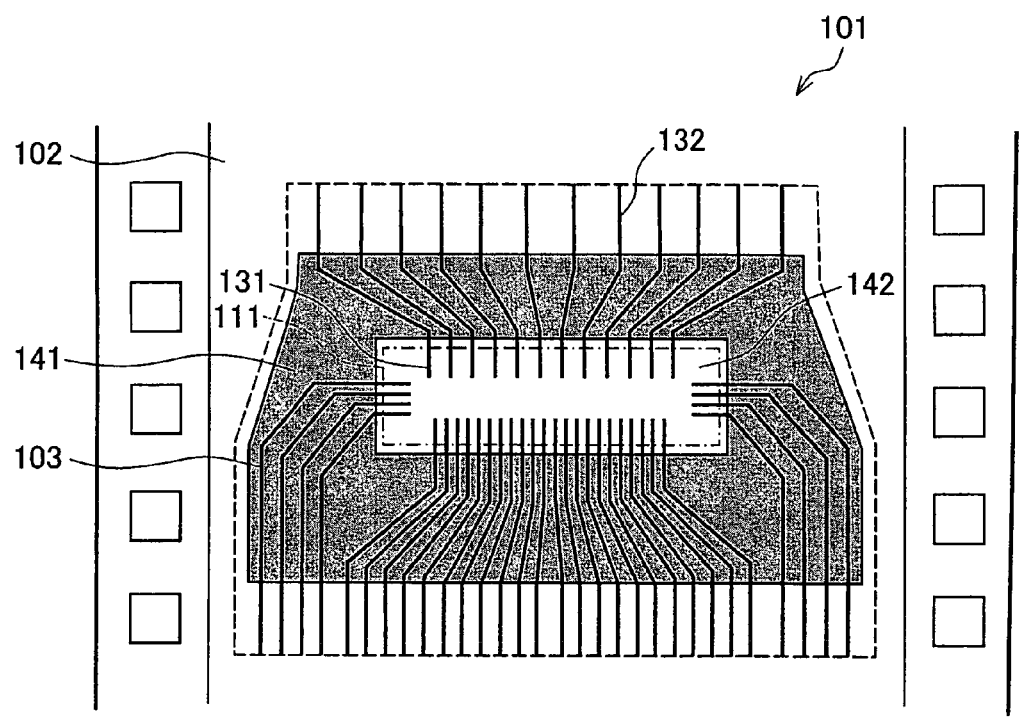
FIG. 7 is a plan view schematically illustrating the flexible wiring board in a conventional COF semiconductor device.
Figure 8:
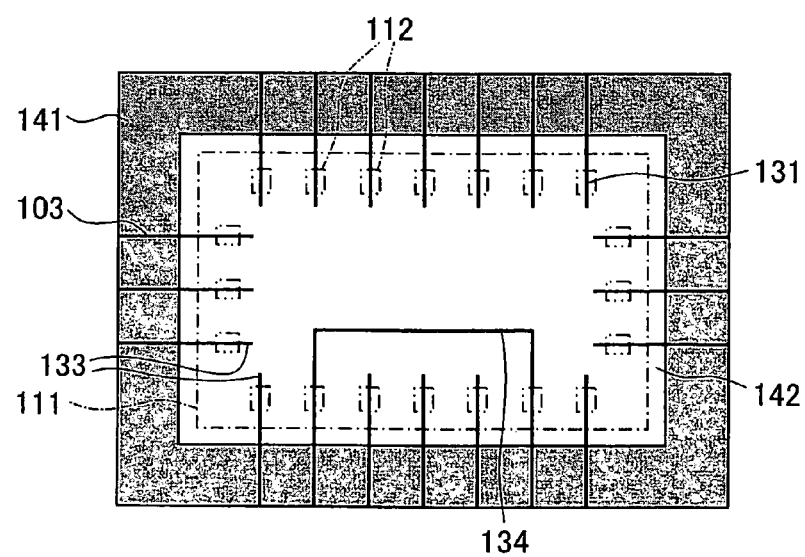
FIG. 8 is a plan view schematically illustrating the semiconductor element mounting area on the conventional flexible wiring board.
Figure 9:
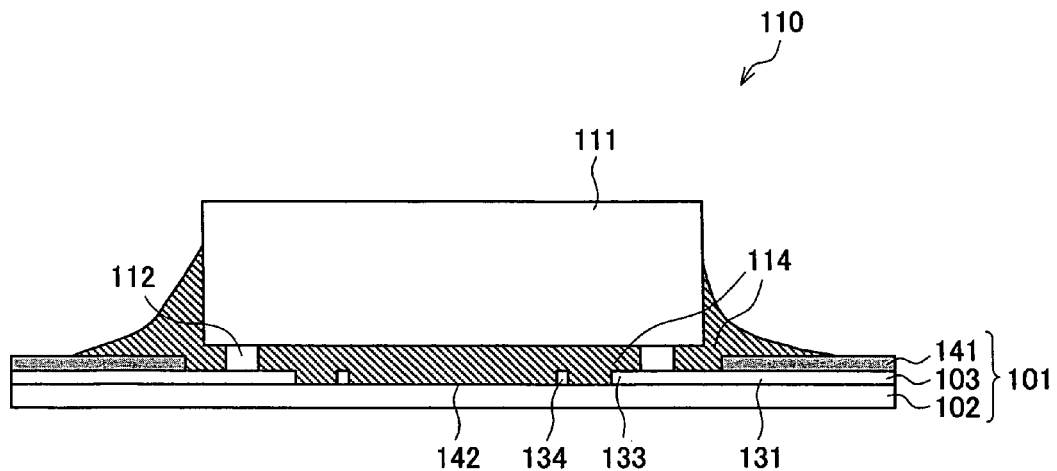
FIG. 9 is a cross-sectional view schematically illustrating the conventional COF semiconductor device.

FIG. 5 schematically shows a cross-sectional view of the semiconductor element 11 and the flexible wiring board 1, before the semiconductor element 11 is mounted, that is, before the bump electrodes 12 and the connection terminals 31 are bonded to each other. FIG. 6 schematically shows a cross-sectional view of the COF semiconductor device 10, after the bump electrodes 12 and the connection terminals 31 have been bonded to each other. The structural components which are identical or have the same action with those in the flexible wiring board 1 and the semiconductor element 11 of the FIGS. 1-4, are labeled with identical references, and their explanation is omitted here.

As shown in FIGS. 5 and 6, the bump electrodes 12 of the semiconductor element 11 are fitted into the solder resist openings 41 and are bonded to the connection terminals 31.

Heat and pressure are applied during the bonding, as will be described after. It is preferable for the bonding that a surface of the bump electrode 12 and the corresponding surface of the connection terminal 31 are respectively made from tin and from gold, or are made from gold. For example, when the surface of the bump electrode 12 is made from gold and the corresponding surface of the connection terminal 31 is also made from gold, the bonding is made by thermocompression. When the surface of the connection terminal 31 is made from tin, a eutectic alloy is made between gold and tin. Therefore, the heat and pressure to be applied can be lower than in the case of thermocompression between gold and gold. In the present embodiment, the bump electrodes 12 are made from gold and the connection terminals 31 are covered with tin, but the present invention is not limited to this arrangement.

As shown in FIGS. 5 and 6, the mounting of the semiconductor element 11 on the flexible wiring board 1 may be arranged such that NCP (Non Conductive Paste) 14 which is an insulating resin is injected on the solder resist openings 42. As will be described later, injection of NCP 14 can prevent the wiring patterns 3 from being exposed, thereby attaining better moisture resistance and also better mechanical strength. Any insulating resin having the effect as described above is preferably used, but is not limited to them. Also, insulating resins for manufacturing conventional semiconductor devices may be suitably used.

A portion except the bump electrode 12 on that surface of the semiconductor element 11 on which the bump electrodes 12 is provided may be covered with PIQ (made by Hitachi Chemical Du Pont Ltd.) resin 13 (insulating layer). The PIQ resin 13 protects the semiconductor element 11, whereby, the reliable semiconductor device is achieved. Note that, the present invention is not limited to PIQ used as the insulating layer in the present embodiment. Any resin materials having an insulating property can be suitably used. Such resin material is, for example, polyimide resin.

Before mounting the semiconductor element 11 on the flexible wiring board 1, NCP is injected into the solder resist openings 42 of the flexible wiring board 1.

Then, the flexible wiring board 1 and the semiconductor element 11 are bonded to each other by using a bonding device (not shown). A bonding process is performed as follows. Firstly, an alignment tool of the bonding device recognizes an alignment mark of the semiconductor element 11 and a corresponding alignment mark of the flexible wiring board 1, and performs alignment of the semiconductor element 11 and the flexible wiring board 1, referring to their alignment marks. Next, by using a heating tool of the bonding device, heat in a range of 70 to 130° C. is applied on the flexible wiring board 1 from above a rear surface thereof, that is, an opposite side of a flexible wiring board surface where the semiconductor element 11 is mounted. Simultaneously, by using a pressurizing tool of the bonding device, pressure is applied from above the semiconductor element 11, that is on an opposite side of a surface on which the bump electrode 12 is provided. The pressure is applied in such a manner that pressure of 50 to 196 mN is applied per bump electrode. In this way, the semiconductor element 1 is temporary fit to the flexible wiring board 1.

If the temporary fitting was done without problems such as misalignment, heat in a range of 150° C. to 250° C. is applied to the flexible wiring board 1 from above the rear side thereof by using the heating tool, while pressure is applied from above the semiconductor element 11, in 2 to 5 seconds, in such a manner that pressure of 20 to 25 gf is applied per bump electrode, by using the heating tool, so that the bump electrodes 12 is bonded to the corresponding connection terminals 31.

As a result of the pressure application, the NCP 14 with which whole area of each solder resist opening 42 are covered, is pushed out to surrounding of the bump electrodes 12 and the connection terminals 31, so that the bump electrodes 12 and the connection terminals 31 are entirely sealed. Therefore, the NCP 14 protects edge parts of the semiconductor element 11 and bonding parts between the bump electrodes 12 and the corresponding connection terminals 31, so that moisture resistance and also mechanical strength rise.

Generally, in order to bond the semiconductor element to the flexible wiring board only by thermocompression of metallic materials of the bump electrodes and the inner leads, heat application of about 400° C. is necessary. Application of such high temperature causes the inner lead to be misaligned from the bump electrode, because thermal shrinkage percentage of the semiconductor element and of the flexible wiring board are different, and thus, this may disadvantageously make a short circuit and leakage, etc.

In this arrangement, however, each bump electrode 12 and the corresponding connection terminal 31 are mechanically bonded to each other by using NCP 14. Thus, they can be bonded to each other by the application of lower temperature. Therefore, such a disadvantage can be prevented.

The present invention can be expressed as follows: The present invention relates to a semiconductor device in which semiconductor elements are provided sequentially on a wiring board having a long-sheet like shape and being prepared by forming wiring pattern on a tape substrate, the wiring board having a surface being wholly covered with solder resist except an opening opened in a position for connection between an inner lead and an Au bump of an electrode of each semiconductor element, and being bonded with the semiconductor elements whose Au bump being fitted in the opening.

In the above semiconductor device, a cupper pattern of the wiring board bonded to each semiconductor element may be tin or gold plated.

In the above semiconductor device, the wirings on the wiring board bonded to the semiconductor element may be covered with the solder resist.

In the above semiconductor device, an area except an electrode portion of the semiconductor element may be coated and protected with an insulating resin.

In the above semiconductor device, a bonding portion between the wiring board and the semiconductor element, and the area of semiconductor element circuit except the electrode portion thereof may be sealed with resin and protected.

The semiconductor device may be arranged such that, before fitting the Au bump into the opening, NCP resin is applied in the opening and the bonding causes the NCP resin to be cured so as to protect the area of semiconductor element circuit except the electrode portion thereof.

In the above semiconductor device, one or more semiconductor elements may be mounted on the wiring board by fitting.

Pointing the above, the flexible wiring board and the COF semiconductor device have been respectively explained as one example of the wiring board and the semiconductor device according to the present invention. But, the present invention is not limited to them.

As described above, a connection structure of the present invention for electrically connecting (i) a plurality of semiconductor element connection terminals of a semiconductor element with (ii) a plurality of wiring board connection terminals of a wiring pattern provided on a wiring board. The wiring board includes a solder resist covering part which covers the wiring pattern with solder resist, the solder resist covering part having a solder resist opening or solder resist openings which expose(s) the wiring board connection terminals therethrough. The solder resist opening or the solder resist openings surrounding at least one part of the solder resist covering part.

In this arrangement, the solder resist opening/the solder resist openings which surround(s) at least one part of the solder resist covering part respectively and independently expose(s) at least one of the wiring board connection terminals. That is, the wiring board connection terminals which are bonded to the corresponding semiconductor element connection terminals, are exposed, and the wiring patterns except the connection terminals on the wiring board are covered with the solder resist. Thus, the wiring patterns are not unnecessarily exposed. That is, without disadvantageous contact between each wiring pattern and the semiconductor element, the semiconductor element can be mounted on the wiring board, and thus, the semiconductor device is reliable.

It is preferably that a surface of each semiconductor element connection terminal and a surface of each wiring board connection terminal are respectively made from gold.

In this arrangement, each semiconductor element connection terminal and the wiring pattern corresponding connection terminal can be easily bonded by thermocompression to each other.

Further, it is preferably that the surface of each semiconductor element connection terminal and the surface of each wiring board connection terminal are respectively made from tin and from gold, or vice versa.

In this arrangement, each semiconductor element connection terminal and the corresponding wiring board connection terminal can be easily bonded to each other by using a eutectic alloy in lower temperature and pressure than by thermocompression.

When bonding by thermocompression or by using the eutectic alloy, heat is added to the semiconductor element and the wiring board, so that they become deformed depending on heat shrinkages of them. Due to a difference between heat shrinkages of them, each wiring board connection terminal has deviated from the corresponding semiconductor element connection terminal, so that they could not be disadvantageously suitably bonded to each other.

In the connection structure for the present semiconductor element, however, an area except the wiring board connection terminals is covered with the solder resist, as described above. Thus, the connection structure is effective as follows:

The connection structure for the semiconductor element according to the present invention is so arranged that the wiring board does not become deformed too much, because the area except the wiring board connection terminals is covered with the solder resist. Therefore, the difference in the heat shrinkage causes the above disadvantage to rarely occur.

It is preferably that the solder resist opening/the solder resist openings is/are sealed with insulating resin.

In this arrangement, when each semiconductor element connection terminal and the corresponding wiring board connection terminal make contact with each other, the above insulating resin becomes deformed, and then, covers periphery of each contact part of them. In this way, the semiconductor element and the wiring board are mechanically bonded to each other by using the deformed insulating resin. Therefore, they can be bonded with each other by using the resin at lower temperature than only by thermocompression or by using the eutectic alloy. As can be seen, the semiconductor element and the wiring patterns can be further prevented from unnecessarily bonding, by covering and protecting the periphery of each contact part.

It is preferably that at least one surface of the semiconductor element which faces the wiring board except the semiconductor element connection terminals is covered with an insulating layer.

In this arrangement, the semiconductor element and the wiring patterns can be further prevented from unnecessarily bonding.

A connection structure according to the present invention may be expressed as follows.

The wiring board of the present invention includes the insulating substrate, the wiring patterns provided on the insulating substrate, and the solder resist covering part where the wiring patterns are covered with the solder resist. The solder resist covering part has a solder resist opening/solder resist openings 42 which expose(s) a part of at least one of the wiring patterns 3. Each wiring pattern in the solder resist opening(s) exposes, therethrough, the wiring board connection terminal for connecting to the semiconductor element connection terminal of the semiconductor element.

In the above arrangement, each wiring pattern except the part (that is, each wiring board connection terminal) which is connected to the semiconductor element connection terminal is not unnecessarily exposed. That is, without disadvantageous contact between each wiring pattern and the semiconductor element, the semiconductor element can be mounted on the wiring board, and thus, the semiconductor device is reliable.

The wiring board of the present invention includes the insulating substrate, the wiring patterns provided on the insulating substrate, and the solder resist covering part where the wiring patterns are covered with the solder resist. The solder resist covering part has a solder resist opening/solder resist openings 42 which expose(s) a part of at least one of the wiring patterns 3. The length of the part (that is, the wiring board connection terminal) of each wiring pattern exposed at the solder resist opening, the part being connected to corresponding semiconductor element connection terminal, may be longer than or equal to the part which is not connected to the semiconductor element connection terminal (that is, non-connection part) of the semiconductor element.

In the above arrangement, it is preferable that an exposed area of the wiring board connection terminals is larger than a non-bonding portion of the wiring board. Thus, the wiring patterns are not unnecessarily exposed. That is, without causing disadvantageous contact between each wiring pattern and the semiconductor element, the semiconductor element can be mounted on the wiring board, and thus, the semiconductor device is reliable.

In the above arrangement, it is preferable that the length of the wiring board connection terminal is larger than the length of the non-connection part.

It is preferable that a distance from a boundary between the solder resist and each solder resist opening to the a part where each semiconductor element connection terminal is bonded on the wiring board, is on the order of 0.01 to 0.15 mm (or in a range of 0.01 to 0.15 mm), or that a distance along a longitudinal direction of the wiring board connection terminal, from a boundary between the solder resist and each solder resist opening to a corresponding connection terminal (a part of the wiring board connection terminal faced to the corresponding semiconductor element connection terminal), is on the order of 0.01 to 0.15 mm (or in a range of 0.01 to 0.15 mm).

With this arrangement, the wiring board is covered with the solder resist except the portion that contributes to the bonding between the wiring board connection terminal and semiconductor element connection terminal. Accordingly, the wiring board is covered with the solder resist so that the solder resist openings surround or sandwich a portion of the wiring board which is covered with the solder resist.

That is, the wiring board connection terminals which are bonded to the corresponding semiconductor element connection terminals, are exposed, and the wiring patterns except the connection terminals on the wiring board are covered with the solder resist. Thus, the wiring patterns are not unnecessarily exposed. That is, without disadvantageous contact between each wiring pattern and the semiconductor element, the semiconductor element can be mounted on the wiring board, and thus, the semiconductor device is reliable.

The embodiment and concrete examples of implementation discussed in the foregoing detailed explanation serve solely to illustrate the technical details of the present invention, which should not be narrowly interpreted within the limits of such an embodiment and concrete examples, but rather may be applied in many variations within the spirit of the present invention, provided such variations do not exceed the scope of the patent claims set forth below.

What is claimed is:

1. A connection structure for electrically connecting a plurality of semiconductor element connection terminals of a semiconductor element with a plurality of wiring board connection terminals of a wiring pattern provided on a wiring board,
    the wiring patter including: a plurality of inner leads respectively having the wiring board connection terminals, and outer leads respectively connected to the inner leads,
    each end of the inner leads opposite to another ends which are connected with the outer leads aligning along an outer circumference of an area where the semiconductor element is mounted, and
    the wiring board including: a solder resist covered peripheral part which covers the inner leads with solder resist, and a solder resist covered center part which covers the area where the semiconductor element is mounted with the solder resist,
    the solder resist covered peripheral part having a solder resist opening/solder resist openings which expose(s) the wiring board connection terminals respectively provided at the ends of the inner leads which are opposite to the another ends connected with the outer leads, and
    the solder resist covered center part covering the ends of the inner leads which are opposite to the another ends connected with the outer leads.

2. The connection structure as set forth in claim 1, wherein a surface of each semiconductor element connection terminal and a surface of each wiring board connection terminal are respectively made from gold.

3. The connections structure as set forth in claim 1, wherein the surface of each semiconductor element connection terminal and the surface of each wiring board connection terminal are respectively made from tin and from gold, or vice versa.

4. The connection structure as set forth in claim 1, wherein the solder resist opening/the solder resist openings is/are sealed with an insulating resin.

5. The connection structure as set forth in claim 1, wherein at least one surface of the semiconductor element which faces the wiring board except the semiconductor element connection terminals is covered with an insulating layer.

6. The connection structure as set forth in claim 1, wherein at least one of distances from a boundary between the solder resist and each solder resist opening to a part of the wiring board connection terminal faced to the corresponding semiconductor element connection terminal is about 0.01 to 0.15 mm.

7. The connection structure as set forth in claim 1, wherein the solder resist opening/the solder resist openings expose(s) the plurality of wiring board connection terminals therethrough.

8. The connection structure as set forth in claim 1, wherein each wiring board connection terminal of the inner leads and a surface of the wiring board which is adjacent to the corresponding wiring board connection terminal are exposed through the solder resist opening(s).

9. The connection structure as set forth in claim 1, wherein each wiring board connection terminal of the inner leads and each surface of the wiring board which is adjacent to the corresponding wiring board connection terminals are exposed through the solder resist opening(s).

10. A wiring board for mounting a semiconductor element thereon, the wiring board comprising:
    an insulating substrate;
    a wiring pattern provided on the insulating substrate,
    the wiring pattern including a plurality of inner leads respectively having wiring board connection terminals of the wiring pattern, and outer leads respectively connected with the inner leads, each end of the inner leads opposite to another ends which are connected with the outer leads aligning along an outer circumference of an area where the semiconductor element is mounted;
    a solder resist covered peripheral part which covers the inner leads with solder resist; and
    a solder resist covered center part, which is on the insulating substrate and covers the area where the semiconductor element is mounted with the solder resist, the solder resist covered peripheral part having a solder resist opening/solder resist openings which expose(s) the wiring board connection terminals respectively provided at the ends of the inner leads which are opposite to the another ends connected with the outer leads, and the solder resist covered center part covering the ends of the inner leads which are opposite to the another ends connected with the outer leads.

11. The wiring board as set forth in claim 10, wherein at least one of the distances from a boundary between the solder resist and each solder resist opening to a part of the wiring board connection terminal faced to the corresponding semiconductor element connection terminal is about 0.01 to 0.15 mm.

12. The wiring board as set forth in claim 10, wherein the solder resist opening/the solder resist openings expose(s) the plurality of wiring board connection terminals therethrough.

13. The wiring board as set forth in claim 10, wherein each wiring board connection terminal of the inner leads and a surface of the wiring board which is adjacent to the corresponding wiring board connection terminal are exposed through the solder resist opening(s).

14. The wiring board as set forth in claim 10, wherein the inner lead(s) exposed through the solder resister opening(s) include(s) a part connected with the semiconductor element connection terminals and a part not connected with the semiconductor element connection terminals, and
    a length of the part connected with the semiconductor element connection terminals is equal to or longer than the part not connected with the semiconductor element connection terminals.

15. A semiconductor device, wherein a semiconductor element is mounted on the wiring board as set forth in claim 10.

16. A semiconductor device, wherein a semiconductor element is mounted on the wiring board as set forth in claim 14.

* * * * *